(12) United States Patent
Feng et al.

(10) Patent No.: US 8,629,700 B2
(45) Date of Patent: Jan. 14, 2014

(54) CAPACITIVE MULTIPLICATION IN A PHASE LOCKED LOOP

(75) Inventors: Yunfei Feng, San Diego, CA (US); Sankaran Aniruddhan, Chennai (IN); Rajagopalan Rangarajan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 79 days.

(21) Appl. No.: 13/353,806

(22) Filed: Jan. 19, 2012

(65) Prior Publication Data

US 2013/0187690 A1 Jul. 25, 2013

(51) Int. Cl.
*H03L 7/06* (2006.01)

(52) U.S. Cl.
USPC .......................... 327/156; 327/147

(58) Field of Classification Search
USPC .................................. 327/147, 156
See application file for complete search history.

(56) References Cited

U.S. PATENT DOCUMENTS

| | | | |
|---|---|---|---|
| 5,180,993 A | 1/1993 | Dent | |
| 8,258,832 B2 * | 9/2012 | Min | 327/156 |
| 2003/0227332 A1 * | 12/2003 | Lee et al. | 331/17 |
| 2005/0134391 A1 | 6/2005 | Kimura et al. | |
| 2006/0141963 A1 | 6/2006 | Maxim et al. | |
| 2007/0132490 A1 * | 6/2007 | Robinson et al. | 327/156 |
| 2010/0277245 A1 | 11/2010 | Liu | |
| 2011/0115535 A1 * | 5/2011 | Min | 327/157 |
| 2011/0156773 A1 * | 6/2011 | Beccue | 327/156 |
| 2012/0200327 A1 * | 8/2012 | Sreekiran et al. | 327/157 |
| 2013/0033293 A1 * | 2/2013 | Zhang | 327/156 |
| 2013/0187690 A1 * | 7/2013 | Feng et al. | 327/157 |

FOREIGN PATENT DOCUMENTS

| | | |
|---|---|---|
| EP | 1471645 A1 | 10/2004 |
| WO | 2007117543 A2 | 10/2007 |

OTHER PUBLICATIONS

Tang, Y., Ismail, M., and Bibyk, S.; "Adaptive Miller Capacitor Multiplier for Compact On-Chip PLL Filter," Electron. Lett., 2003, 39, (1), pp. 43-45.
Shu, K., Sanchez-Sinencio, E., Silva-Martinez, J., and Embabi, S.; "A 2.4-GHz Monolithic Fractional-N Frequency Synthesizer with Robust Phase-Switching Prescaler and Loop Capacitance Multiplier," IEEE J. Solid-State Circuits, 2003, 38, (6), pp. 866-874.
International Search Report and Written Opinion—PCT/US2013/022152—ISA/EPO—Jun. 6, 2013.

* cited by examiner

*Primary Examiner* — Adam Houston
(74) *Attorney, Agent, or Firm* — Kenyon S. Jenckes

(57) ABSTRACT

A frequency synthesizer circuit is disclosed. The frequency synthesizer circuit includes a phase and frequency detector. The frequency synthesizer circuit also includes a first charge pump and a second charge pump, each coupled to the phase and frequency detector. The frequency synthesizer circuit also includes a loop filter that includes a resistor and at least two capacitors. The second charge pump is coupled between the resistor and a capacitor that creates a zero in a transfer function of the loop filter. The frequency synthesizer circuit also includes a voltage controlled oscillator that produces an output frequency based on an output of the loop filter.

16 Claims, 9 Drawing Sheets

CAPACITIVE MULTIPLICATION IN A PHASE LOCKED LOOP

TECHNICAL FIELD

The present disclosure relates generally to communication systems. More specifically, the present disclosure relates to a phase locked loop using capacitive multiplication.

BACKGROUND

Electronic devices (cellular telephones, wireless modems, computers, digital music players, Global Positioning System units, Personal Digital Assistants, gaming devices, etc.) have become a part of everyday life. Small computing devices are now placed in everything from automobiles to housing locks. The complexity of electronic devices has increased dramatically in the last few years. For example, many electronic devices have one or more processors that help control the device, as well as a number of digital circuits to support the processor and other parts of the device.

Wireless communication systems are widely deployed to provide various types of communication content such as voice, video, data and so on. These systems may be multiple-access systems capable of supporting simultaneous communication of multiple wireless communication devices with one or more base stations.

Mobile devices may include a variety of circuits used during operation. For example, an oscillator may be used to synchronize various circuits across a board or integrated circuit within a mobile device. Furthermore, different circuits within a mobile device may operate using different frequencies. Therefore, mobile devices may generate multiple reference signals for different purposes.

Frequency synthesizer circuits may use capacitors for a variety of reasons. However, capacitors may require a relatively large area when implemented as integrated circuit. Therefore, it may be beneficial to reduce the area of capacitors where possible. A Miller capacitor multiplier is described in "Adaptive Miller capacitor multiplier for compact on-chip PLL filter" by Tang, Y., Ismail, M., and Bibyk, S. in Electronics Letters, 2003, 39, (1), pp. 43-45. A loop capacitance multiplier is described in "A 2.4-GHz monolithic fractional-N frequency synthesizer with robust phase-switching prescaler and loop capacitance multiplier" by Shu, K., Sanchez-Sinencio, E., Silva-Martinez, J., and Embabi, S. in IEEE Journal of Solid-State Circuits, 2003, 38, (6), pp. 866-874.

SUMMARY OF THE INVENTION

A frequency synthesizer circuit is disclosed. The frequency synthesizer circuit includes a phase and frequency detector. The frequency synthesizer circuit also includes a first charge pump and a second charge pump, each coupled to the phase and frequency detector. The frequency synthesizer circuit also includes a loop filter that includes a resistor and at least two capacitors. The second charge pump is coupled between the resistor and a capacitor that creates a zero in a transfer function of the loop filter. The frequency synthesizer circuit also includes a voltage controlled oscillator that produces an output frequency based on an output of the loop filter.

The frequency synthesizer circuit may also include an N-divider that is coupled to an output of the voltage controlled oscillator and an input of the phase and frequency detector. The N-divider may be a fractional N-divider that alternates between dividing the output frequency of the voltage controlled oscillator by a first divide factor and a second divide factor. The frequency synthesizer circuit may also include a sigma-delta modulator that randomizes selection of each divide factor used by the fractional N-divider while maintaining a desired time-average ratio between the divide ratios. The phase and frequency detector may produce an error signal that indicates a difference in phase and frequency of a reference signal and a divided output signal of the voltage controlled oscillator.

In one configuration, the first charge pump produces a first current and the second charge pump produces a second current, where the first current combines with the second current to produce a third current that flows through the capacitor that creates a zero in a transfer function of the loop filter. The third current may be smaller than the first current, which increases the effective capacitance (Ceq) of the capacitor that creates a zero in a transfer function of the loop filter. Alternatively, the third current may be larger than the first current, which decreases the effective capacitance (Ceq) of the capacitor that creates a zero in a transfer function of the loop filter. The effective capacitance (Ceq) of the capacitor that creates a zero in a transfer function of the loop filter may be given by $Ceq=C1/(1-\alpha)$ where C1 is the capacitance of the capacitor that creates a zero in a transfer function of the loop filter and $\alpha$ is a ratio of the second current to the first current.

An integrated circuit for capacitive multiplication is also disclosed. The integrated circuit includes a phase and frequency detector. The integrated circuit also includes a first charge pump and a second charge pump, each coupled to the phase and frequency detector. The integrated circuit also includes a loop filter comprising a resistor and at least two capacitors, wherein the second charge pump is coupled between the resistor and a capacitor that creates a zero in a transfer function of the loop filter. The integrated circuit also includes a voltage controlled oscillator that produces an output frequency based on an output of the loop filter.

A method for capacitive multiplication is also disclosed. An error between a phase and frequency of a reference signal and a divided voltage controlled oscillator (VCO) output is detected. A first current is produced using a first charge pump and a second current is produced using a second charge pump. Net current through a capacitor that creates a zero in the transfer function of a loop filter is adjusted by adding or subtracting the second current to or from the first current. A tuning voltage is determined for the VCO based on an output of the loop filter.

A frequency synthesizer for capacitive multiplication is also disclosed. The frequency synthesizer includes means for detecting an error between a phase and frequency of a reference signal and a divided voltage controlled oscillator (VCO) output. The frequency synthesizer also includes means for producing a first current and a second current. The frequency synthesizer also includes means for adjusting net current through a capacitor that creates a zero in the transfer function of a loop filter by adding or subtracting the second current to or from the first current. The frequency synthesizer also includes means for determining a tuning voltage for the VCO based on an output of the loop filter.

DETAILED DESCRIPTION

Phase locked loops (PLLs) may be used in electronic devices, e.g., to synthesize various frequencies. Loop filters may consume a relatively large area within analog PLLs compared to other components. For example, the zero-producing capacitor of a type II nth order PLL may be large, e.g., 100 pF to several nF. Since capacitor densities may not scale as easily as active devices, the loop filter may present problems for integrated circuits. Therefore, the present systems and methods enable the reduction of loop filter (LPF) area by introducing an innovative PLL using capacitive multiplication.

Figure 1:
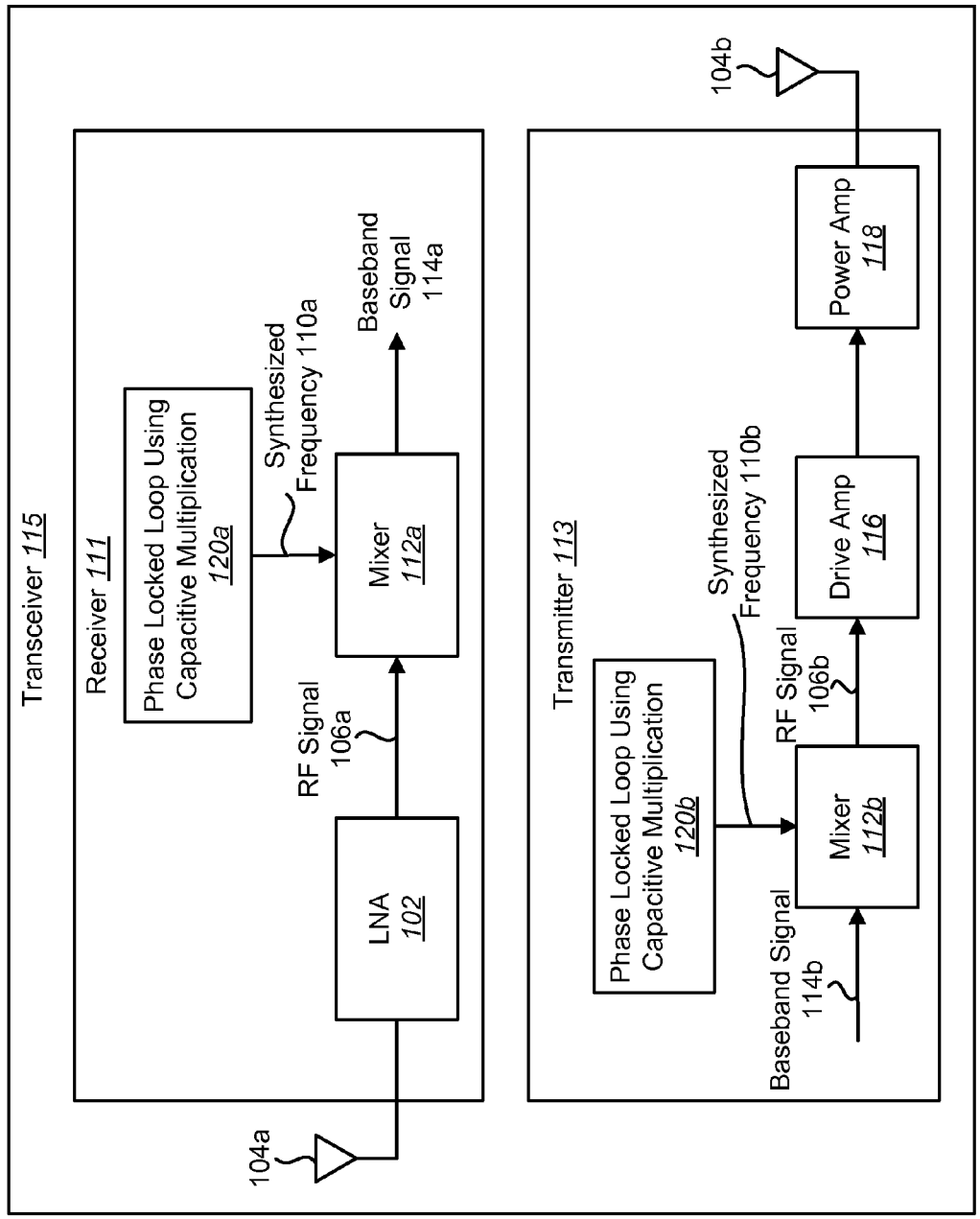
FIG. 1 is a block diagram illustrating a transceiver that includes a receiver and a transmitter that each includes phase locked loop (PLL) using capacitive multiplication.

FIG. 1 is a block diagram illustrating a transceiver 115 that includes a receiver 111 and a transmitter 113 that each includes phase locked loop (PLL) using capacitive multiplication 120a-b. The transceiver 115 may be part of a mobile device or base station designed for wireless communication. The receiver 111 may include, among other things, a low noise amplifier (LNA) 102, a phase locked loop (PLL) using capacitive multiplication 120a and a mixer 112a. The LNA 102 may receive a wireless communication signal from an antenna 104a. The LNA 102 may amplify the received signal to usable levels and produce a radio frequency (RF) signal 106a, i.e., a representation of the original signal sent. The PLL using capacitive multiplication 120a may output a synthesized frequency 110 directed to a particular application. The PLL using capacitive multiplication 120a may be capable of producing different frequencies. Although illustrated in the receiver 111, the PLL using capacitive multiplication 120a may be used in various applications in a mobile device or base station designed for wireless communication. The mixer 112a may receive the RF signal 106a from the LNA 102 and the synthesized frequency 110a from the PLL using capacitive multiplication 120a and produce a baseband signal 114a. The baseband signal 114a may be the actual reconstructed audio received by a microphone on a transmitting device, e.g., voiced speech or other kinds of data. Thus, the receiver 111 may use the mixer 112a to reconstruct the baseband signal 114a.

The transmitter 113 may include, among other things, a PLL using capacitive multiplication 120b, a mixer 112b, a drive amplifier 116 and a power amplifier 118. Like before, the PLL using capacitive multiplication 120b produce the synthesized frequency 110b. The mixer 112b may receive the synthesized frequency 110b and a baseband signal 114b (e.g., voiced speech), and produce an RF signal 106b. In other words, the transmitter 113 may use the mixer 112b to produce a modulated, high frequency RF signal 106b to be transmitted. Before the RF signal 106b is transmitted via an antenna 104b, it may be amplified by a drive amplifier 116, a power amplifier 118 or both. Thus, the transmitter 113 may use the mixer 112b to construct an RF signal 106b for transmission.

Figure 2:
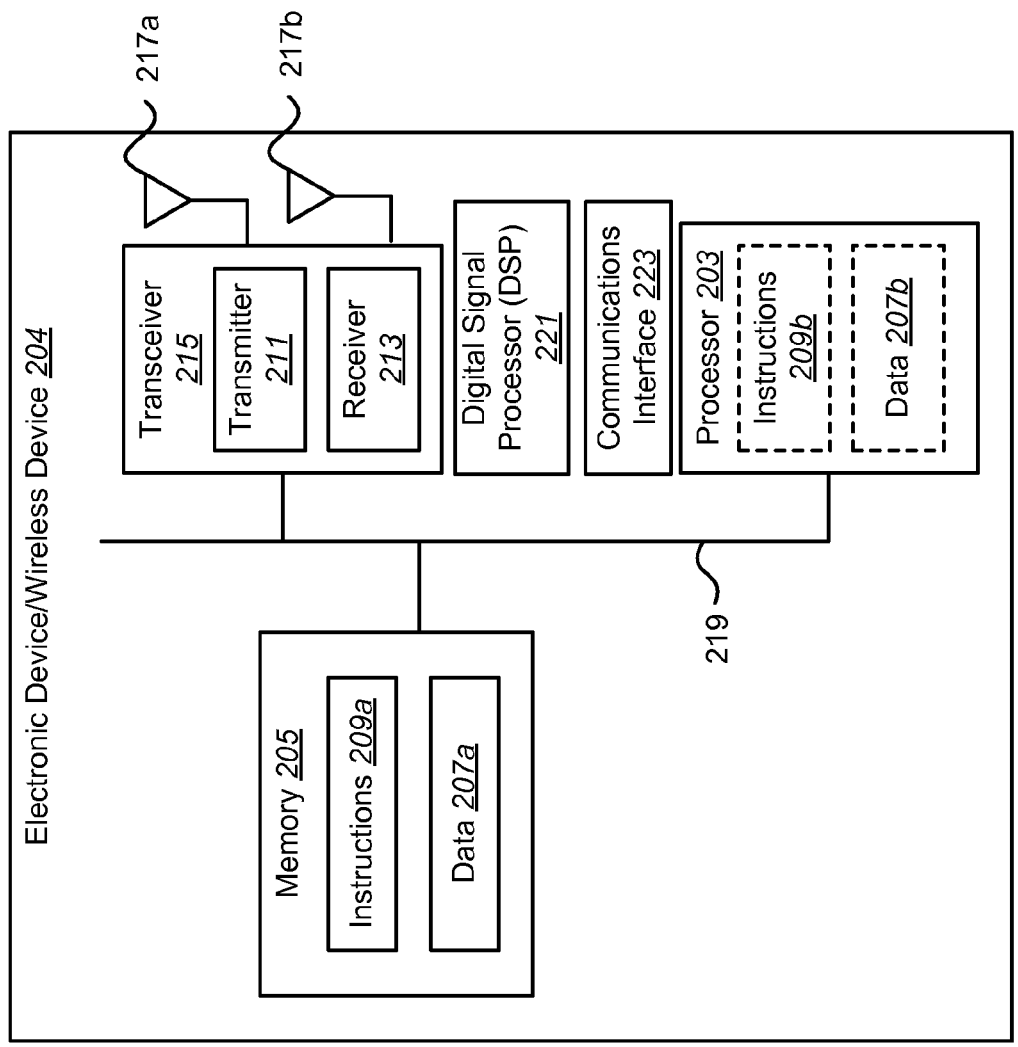
FIG. 2 illustrates certain components that may be included within an electronic device/wireless device.

FIG. 2 illustrates certain components that may be included within an electronic device/wireless device 204. The electronic device/wireless device 204 may be an access terminal, a mobile station, a user equipment (UE), a base station, an access point, a broadcast transmitter, a node B, an evolved node B, etc. For example, the transceiver 215 in the electronic device/wireless device 204 may be the transceiver 115 illustrated in FIG. 1. The electronic device/wireless device 204 includes a processor 203. The processor 203 may be a general purpose single- or multi-chip microprocessor (e.g., an ARM), a special purpose microprocessor (e.g., a digital signal processor (DSP)), a microcontroller, a programmable gate array, etc. The processor 203 may be referred to as a central processing unit (CPU). Although just a single processor 203 is shown in the electronic device/wireless device 204 of FIG. 2, in an alternative configuration, a combination of processors (e.g., an ARM and DSP) could be used.

The electronic device/wireless device 204 also includes memory 205. The memory 205 may be any electronic component capable of storing electronic information. The memory 205 may be embodied as random access memory (RAM), read-only memory (ROM), magnetic disk storage media, optical storage media, flash memory devices in RAM, on-board memory included with the processor, EPROM memory, EEPROM memory, registers, and so forth, including combinations thereof.

Data 207a and instructions 209a may be stored in the memory 205. The instructions 209a may be executable by the processor 203 to implement the methods disclosed herein. Executing the instructions 209a may involve the use of the data 207a that is stored in the memory 205. When the processor 203 executes the instructions 209a, various portions of the instructions 209b may be loaded onto the processor 203, and various pieces of data 207b may be loaded onto the processor 203.

The electronic device/wireless device 204 may also include a transmitter 211 and a receiver 213 to allow transmission and reception of signals to and from the electronic device/wireless device 204. The transmitter 211 and receiver 213 may be collectively referred to as a transceiver 215. Multiple antennas 217a-b may be electrically coupled to the transceiver 215. The electronic device/wireless device 204 may also include (not shown) multiple transmitters, multiple receivers, multiple transceivers and/or additional antennas.

The electronic device/wireless device 204 may include a digital signal processor (DSP) 221. The electronic device/wireless device 204 may also include a communications interface 223. The communications interface 223 may allow a user to interact with the electronic device/wireless device 204.

The various components of the electronic device/wireless device 204 may be coupled together by one or more buses, which may include a power bus, a control signal bus, a status signal bus, a data bus, etc. For the sake of clarity, the various buses are illustrated in FIG. 2 as a bus system 219.

Figure 3:
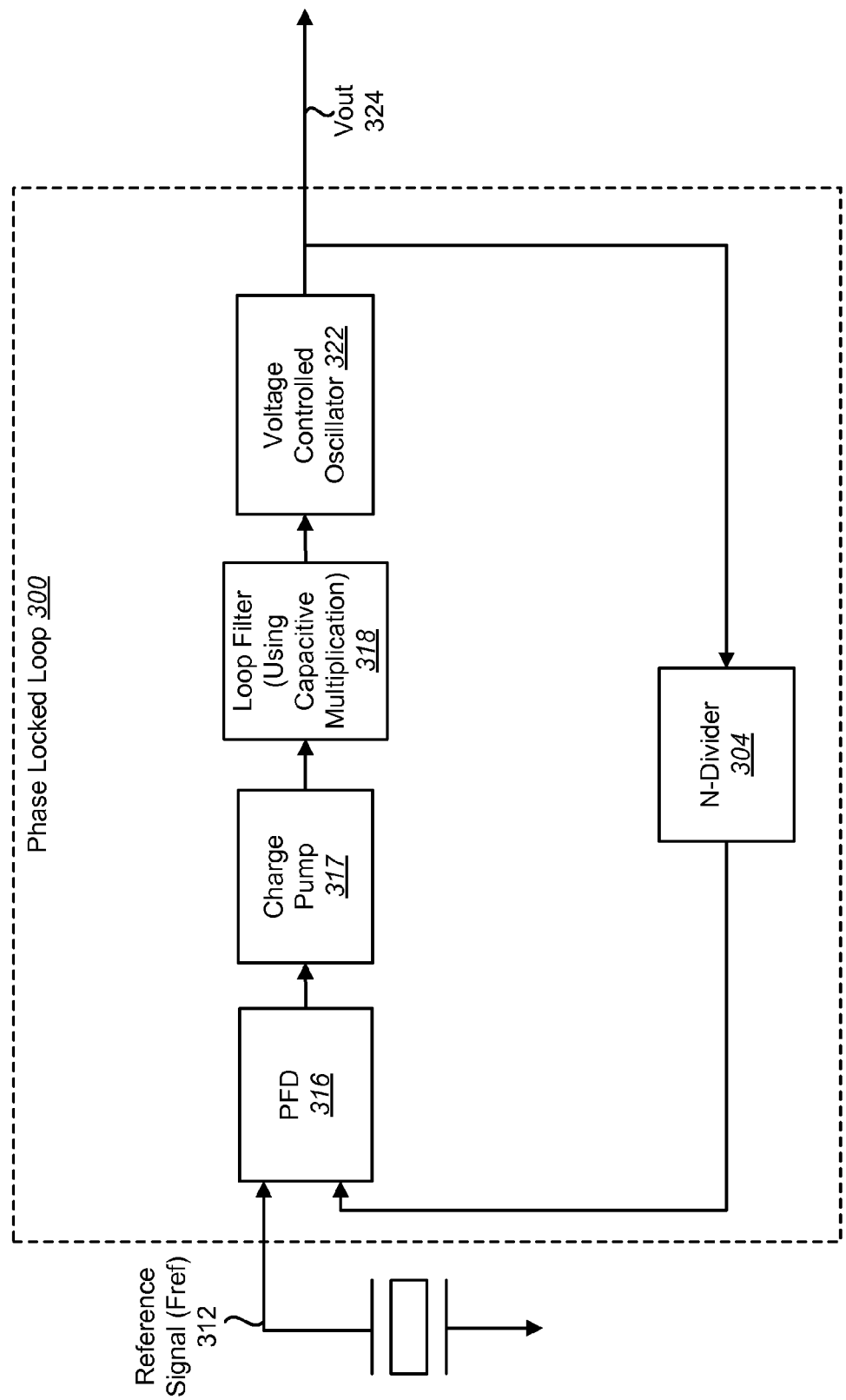
FIG. 3 is a block diagram illustrating a phase locked loop (PLL) using capacitive multiplication.

FIG. 3 is a block diagram illustrating a phase locked loop (PLL) 300 that may implement the present systems and methods. The PLL 300 may be implemented on a single integrated circuit and may include various modules in a feedback configuration. Specifically, the PLL 300 may implement a frequency synthesizer that is capable of generating a range of frequencies from a reference signal 312, e.g., an oscillator.

In one configuration, a reference signal 312 with a predetermined frequency may be provided by a crystal oscillator and/or another suitable signal generator, from which the PLL 300 may generate an output signal, Vout 324, that is fixed (i.e., locked) in frequency and/or phase to the reference signal 312. The PLL 300 may also include a phase frequency detector (PFD) 316, a charge pump 317, a loop filter 318 and one or more voltage controlled oscillators (VCOs) 322 operating in a closed feedback loop. Optionally, the frequency synthesizer may also include an r-divider (not shown) that may alter the reference signal 312 prior to comparison at the PFD 316, e.g., divide the frequency of the reference signal 312.

In one configuration, the PFD 316 may compare the reference signal 312 to the output of an n-divider 304 in the feedback loop. The output of the n-divider 304 may be a signal with a frequency equal to the frequency of the output signal, Vout 324, divided by an integer parameter N. The PFD 316 may determine any differences in phase and/or frequency between the output of the n-divider 304 and the reference signal 312 and express this difference as "pump up" or "pump down" pulses to the charge pump 317. The charge pump 317 may then provide charge to a loop filter 318 that may filter the charge pump 317 output to the tuning port of the VCO 322. For example, the PFD 316 may generate a digital output signal consisting of high and/or low pulses of varying lengths. The charge pump 317 may receive this signal and produce an output corresponding to the pump up and/or pump down signals from the PFD 316. The charge pump 317 output may subsequently be filtered by the loop filter 318 to provide a stable voltage level to the VCO(s) 322. If implemented as an integrated circuit, the loop filter 318 may consume a relatively large area compared to the overall area for the PLL 300. Specifically, the loop filter 318 may include one or more capacitors that are difficult to scale down with other components.

The present systems and methods may split the charge pump 317 into a first charge pump and a second charge pump in order to use capacitive multiplication in the loop filter 318. One advantage of the present systems and methods is that it does not include an operational amplifier that may introduce noise to the PLL 300 and limit operating voltages in the PLL 300 (due to rail-to-rail output swing limitations of the operational amplifier). Another advantage is that it does not use increased area for a parallel current mirror that may introduce noise and cause reference spurs to the PLL 300 (due to possible mismatch and leakage current in the current minors). As used herein, the term "capacitive multiplication" refers to any technique used to increase an effective capacitance of a capacitor without increasing the actual size of the capacitor. For example, the present systems and methods may use the second charge pump (not shown) to bleed current away from a capacitor in the loop filter 318, causing the capacitor to charge more slowly for a given current (as compared to without bleeding current from the capacitor). Therefore, the effective capacitance may be increased without increasing the physical area of the capacitor. In contrast to other capacitive multiplication configurations, the present systems and methods may not require an operational amplifier or current mirror in parallel with the capacitor that causes a zero in the transfer function of the loop filter 318. This lack of parallel operational amplifier and current mirror may reduce unwanted noise and area for a PLL 300.

Upon receiving a signal from the charge pump 317 via the loop filter 318, the VCO 322 may generate an output signal (Vout) 324 having a frequency based on the voltage level of the input signal provided by the loop filter 318. Signal generation at the VCO 322 may be performed by a VCO core, e.g., an LC circuit. In one configuration, capacitances may be moved in or out of the VCO core to produce oscillation at different frequencies. Additionally, a VCO buffer may amplify the output of the VCO core. The VCO output signal (Vout) 324 may be divided and compared again to the reference signal 312 to facilitate continuous adjustment of Vout 324 in relation to the reference signal 312.

Figure 4:
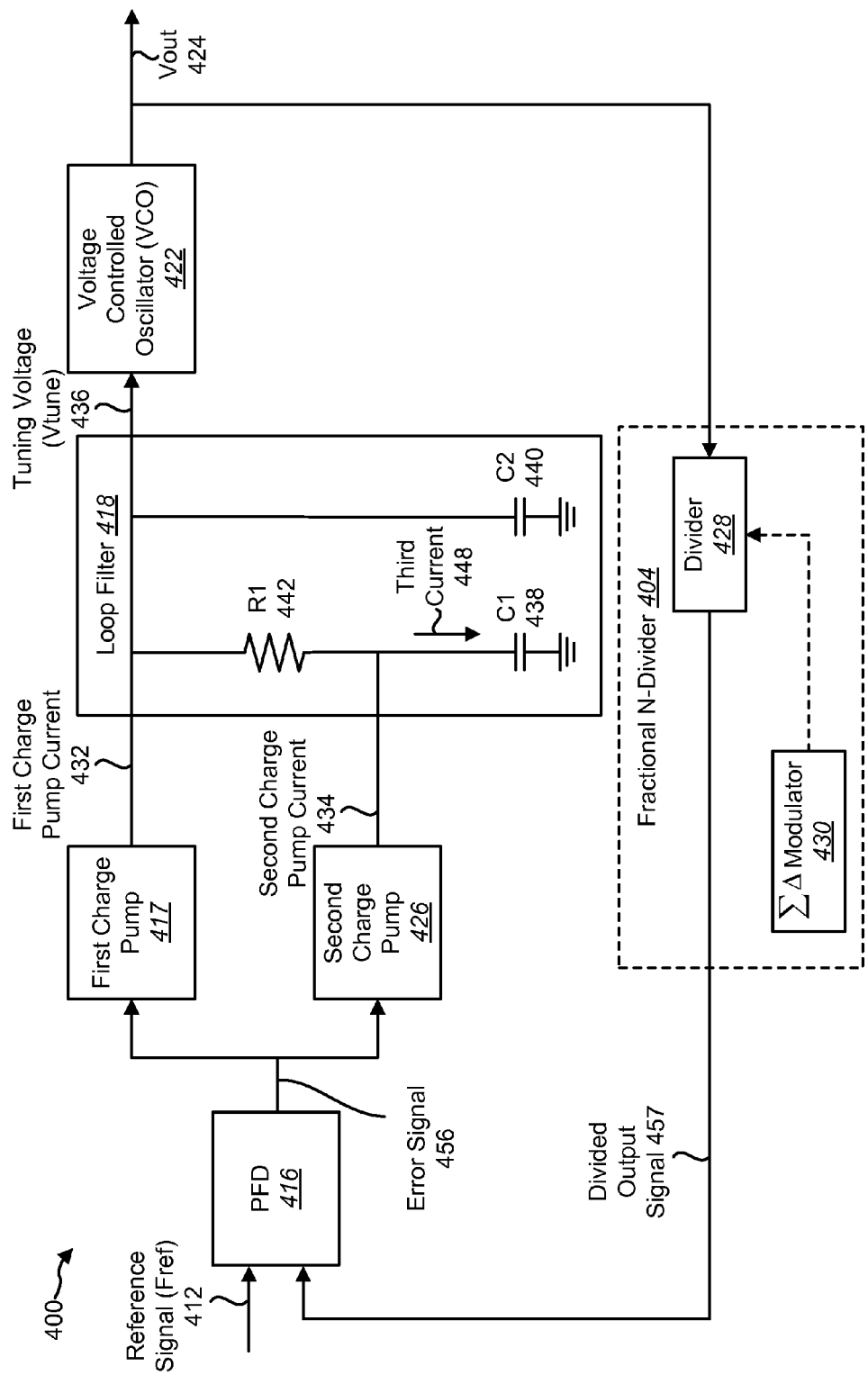
FIG. 4 is a block diagram illustrating a phase locked loop (PLL) using capacitive multiplication.

FIG. 4 is a block diagram illustrating a phase locked loop (PLL) 400 using capacitive multiplication. In order to reduce loop filter 418 area using capacitive multiplication, the present systems and methods may use a PLL 400 that includes a phase and frequency detector (PFD) 416, a first charge pump 417, a second charge pump 426, a loop filter 418, a voltage controlled oscillator (VCO) 422 and a fractional n-divider 404. As before, the PLL 400 may receive a reference signal 412 and generate a range of frequencies at an output signal (Vout) 424.

The PFD 416 may compare the reference signal 412 to the output of the fractional n-divider 404 in the feedback loop, i.e., the PFD 416 may compare the reference signal 412 to a divided output signal 457. The fractional n-divider 404 may include a divider 428 that is capable of divide-by-N and divide-by-(N+1). The divider 428 may alternate between these two different divide factors to so that the PLL 400 settles at a particular frequency, i.e., by varying the percentage of time the divider 428 spends using each divide factor the output frequency of Vout 424 may be selected with relatively high granularity. Furthermore, an optional sigma-delta modulator 430 may randomize the selection of each divide factor while maintaining desired time-average ratios between the two divide factors. This may reduce spurious signals in Vout 424 caused by a periodic switching between two divide ratios. Therefore, the divided output signal 457 may be a signal with a frequency equal to the frequency of the output signal, Vout 424, divided by a parameter between N and N+1.

The PFD 416 may express the difference between the reference signals 412 and the divided output signal 457, i.e., an error signal 456. While shown as a single connection, the first charge pump 417 and second charge pump 426 may receive multiple connection lines from the PFD 416. For example, the PFD 416 may include one "UP" output and one "DOWN" output. Each PFD 416 output (UP or DOWN) may split into two lines received, one received at the first charge pump 417 and one received at the second charge pump 426. The input to first charge pump 417 may be the same as the input to the second charge pump 426, but received at different pin connections inside.

The first charge pump 417 may provide a first charge pump current 432 to the loop filter 418 and the second charge pump 426 may provide a second charge pump current 434 to the loop filter 418. The second charge pump 426 may be coupled to a capacitor that creates a zero in the transfer function of the loop filter 418 (C1 438 in the illustrated PLL 400). The loop filter 418 may also include one or more capacitors (i.e., the second capacitor (C2) 440) that generate one or more poles in the transfer function of the loop filter 418. The output of the loop filter 418 may serve as the tuning voltage (Vtune) 436 for the voltage controlled oscillator (VCO) 422. The transfer function of the loop filter 418 may be given by Equation (4):

$$\frac{V_{out}}{i_{cp1}} = \frac{1-\alpha}{C_1+C_2} \cdot \frac{1+sR_1\left(\frac{C_1-\alpha C_2}{1-\alpha}\right)}{s\left(1+sR_1\frac{C_1 C_2}{C_1+C_2}\right)} \qquad (4)$$

where Vout is the output of the loop filter 418 (i.e., the tuning voltage 436), Icp1 is the first charge pump current 432 and α is the ratio of the second charge pump current (Icp2)

434 to first charge pump current (Icp1) 432. Typically, C2 ≪ C1. Therefore, the zero is at $$\frac{1}{sR_1\left(\frac{C_1}{1-\alpha}\right)}.$$

This means that with a physical capacitance of C1, we can generate a zero frequency equivalent to that with $$\frac{C_1}{1-\alpha},$$

thus realizing capacitive multiplication. Although illustrated as having a single RC branch and a single C branch, the present systems and methods may be used with loop filters 418 of different configurations. In other loop filter 418 configurations, additional resistors and capacitors may be attached at the loop filter 418 output to generate additional pole(s) to achieve a desired loop filter response 418.

The present systems and methods may use capacitive multiplication to increase the effective capacitance of the first capacitor (C1) 438, i.e., to increase the effective capacitance of C1 438 as seen by the first charge pump 417. Specifically, the second charge pump current 434 may bleed off some of the first charge pump current 432 so that the net current running through C1 438 (i.e., the third current 448) is reduced. C1 438 may then charge more slowly as though it were a larger capacitor. In other words, the effective capacitance for a given first charge pump current 432 is increased because the third current 448 is smaller than the first charge pump current 432. Therefore, an integrated circuit using a dual-charge pump configuration may use a smaller capacitor C1 438 to achieve a particular effective capacitance for C1 438 than a single-charge pump configuration, i.e., coupling a second charge pump 426 between the resistor (R1) 442 and first capacitor (C1) 438 in the loop filter 418 may multiply the effective capacitive of C1 438 per amount of first charge pump current 432. In other words, the area used for a given effective capacitance of C1 438 on an integrated circuit may be decreased in a dual-charge pump configuration while maintaining the same PLL loop transfer function.

This configuration may be implemented simply without additional biasing or operational amplifiers. Furthermore, the second charge pump 426 may be implemented with control signals so that it may be entirely turned off and the PLL 400 may operate with only the first charge pump 417.

Figure 5:
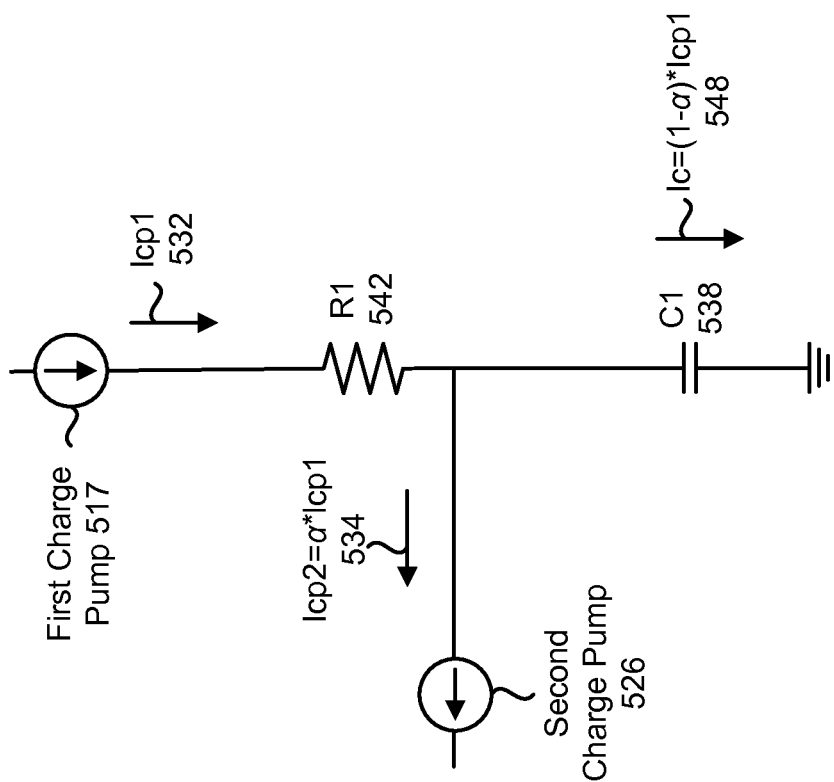
FIG. 5 is a circuit diagram illustrating capacitive multiplication.

FIG. 5 is a circuit diagram illustrating capacitive multiplication. For example, the PLL 400 illustrated in FIG. 4 may utilize capacitive multiplication as shown in FIG. 5. Specifically, the first charge pump 517 is modeled as a first current source and the first charge pump current 532 is referred to as Icp1 532. Similarly, the second charge pump 526 is modeled as a second current source and the second charge pump current 534 is referred to as Icp2 534. In implementation, the first charge pump 517 and second charge pump 526 may be implemented using any circuitry capable of producing a specified amount of current from a reference voltage, e.g., a current minor. The resistor (R1) 542 and capacitor (C1) 538 correspond to and function similarly to the resistor (R1) 442 and first capacitor (C1) 438 illustrated in FIG. 4, respectively. For illustration purposes, assume the first charge pump current (Icp1) 532 is related to the second charge pump current (Icp2) 534 according to Equation (1):

$$Icp2 = \alpha * Icp1 \tag{1}$$

where α is the ratio of the second charge pump current (Icp2) 534 to first charge pump current (Icp1) 532. Since the second charge pump current (Icp2) 534 flows away from the RC branch, it may reduce the first charge pump current (Icp1) 532 before flowing through the capacitor (C1) 538. Therefore, the current (Ic) 548 (i.e., the third current 448) flowing through C1 538 may be given according to Equation (2):

$$Ic = (1-\alpha) * Icp1 \tag{2}$$

Therefore, the effective capacitance (Ceq) seen by the first charge pump current (Icp1) 532 may be given according to Equation (3):

$$Ceq = C1/(1-\alpha) \tag{3}$$

For example, if α=3/4 (i.e., Icp2 534 is 3/4 of Icp1 532), then Ceq=4*C1, i.e., the effective capacitance of C1 538 may quadruple using capacitive multiplication. Other values for the current ratio may be used. By changing the current ratio (α), a PLL 400 may save area in implementing C1 538 or improve Integrated Phase Noise (IPN) for a given area.

Although the second charge pump current (Icp2) 534 is illustrated as reducing or subtracting from the first charge pump current (Icp1) 532, the second charge pump current (Icp2) 534 may alternatively increase or add to the first charge pump current (Icp1) 532, thus reducing the effective capacitance of C1 538 (i.e., the capacitor that creates a zero in the transfer function of the loop filter) using capacitive multiplication.

Figure 6:
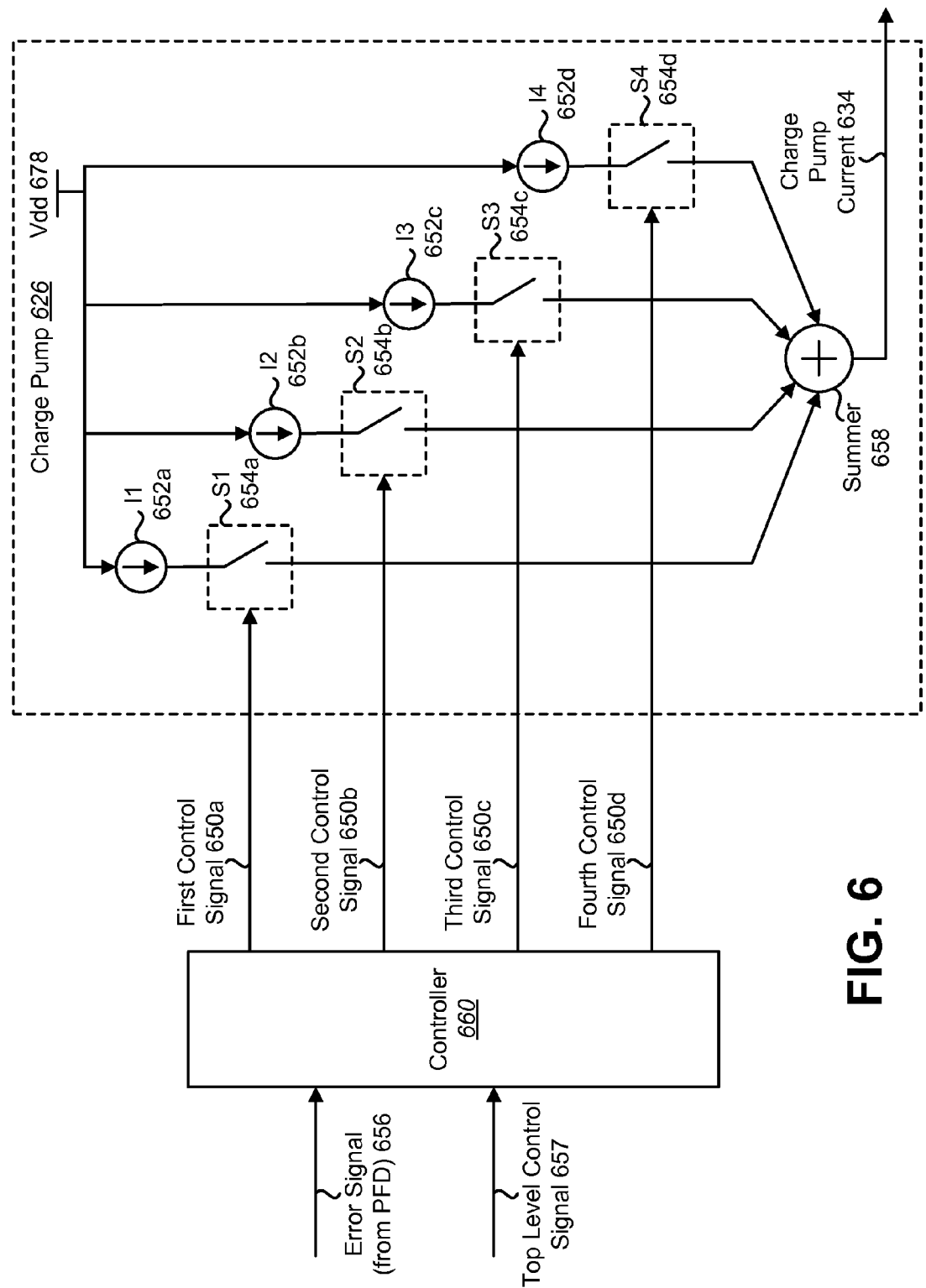
FIG. 6 is a block diagram illustrating a charge pump that may be used in a phase locked loop (PLL) using capacitive multiplication.

FIG. 6 is a block diagram illustrating a charge pump 626 that may be used in a phase locked loop (PLL) using capacitive multiplication. For example, the charge pump 626 may be used to implement the second charge pump 426 in a PLL 400 using capacitive multiplication illustrated in FIG. 4. Specifically, the charge pump 626 may receive an error signal 656 from a phase and frequency detector (not shown) and one or more control signals 650a-d to produce a charge pump current 634. As described above, the charge pump current 634 may be used to bleed off first charge pump current 432 to reduce the amount of current that flows through a capacitor (C1) 438 in the loop filter, i.e., a capacitor that creates a zero in the transfer function of the loop filter.

The charge pump 626 may include one or more current sources (I1-I4) 652a-d, one or more switches (S1-S4) 654a-d and a summer 658. Each current source (I1-I4) 652a-d may be coupled to Vdd 678. The controller 660 may receive an error signal 656 (e.g., from the PFD) and send control signals each current source (I1-I4) 652a-d. In one configuration, the error signal 656 from the PFD may control whether or not a charge pump 626 is ON or OFF in general. The error signal 656 may also control how long each charge pump 626 is in the ON state, i.e., the length of ON state. For example, the top level control signal 657 may determine whether the first charge pump 417, the second charge pump 426, or both are turned ON. Furthermore, the controller 660 may also receive a top level control signal 657 that may control how many charge pump branches (e.g., current sources (I1-I4) 652a-d) within a charge pump 626 are ON, thus controlling the total amount of current in the charge pump current 634. The current produced by each current source (I1-I4) 652a-d may be equal. Alternatively, the amount of current may be different for each branch. For example, the second current source (I2) 652b may produce twice as much current as the first current source (I1) 652a, the third current source (I3) 652c may produce twice as much current as the second current source (I2) 652b, etc., i.e., binary increment. The switches (S1-S4) 654a-d may be implemented using field effect transistors (FET), e.g., N-channel FETs or P-channel FETs.

The control signals 650a-d may be received from a controller 660. These control signals 650a-d may be determined based, at least in part, on the error signal 656 received from the PFD. The number of control signals 650a-d may be equal the number of branches in the charge pump 626, i.e., each branch includes a current source (I1-I4) 652a-d and a switch (S1-S4) 654a-d. Specifically, there may be a control signal 650a-d to control each switch (S1-S4) 654a-d in the charge pump 626. Therefore, four control signals 650a-d are received at the four switches (S1-S4) 654a-d, respectively, in the illustrated configuration. Based on the particular control signal 650a-d received, a switch (S1-S4) 654a-d may turn on or off to conditionally allow the current from the current sources (I1-I4) 652a-d to be summed as part of the charge pump current 634, i.e., the current is not summed if the coupled switch (S1-S4) 654a-d is turned off while the current is summed if the coupled switch (S1-S4) 654a-d is turned on. Therefore, any combination of current is possible using the control signals 650a-d.

For example, if all switches (S1-S4) 654a-d were turned on, a maximum amount of current may be drained off the first charge pump current (not shown), i.e., a may be near one (but still less than one). This may maximize the effective capacitance (per unit of first charge pump current 432) of the capacitor in the loop filter 418 that creates a zero in the transfer function of the loop filter 418. Alternatively, if some but less than all of the switches (S1-S4) 654a-d are turned on, less than the maximum amount of current may be drained off the first charge pump current (not shown), i.e., 0<α<1. This may still increase the effective capacitance (per unit of first charge pump current) of a capacitor in the loop filter that creates a zero in the transfer function of the loop filter, but not as much as if all switches (S1-S4) 654a-d were turned on. Alternatively, no switches (S1-S4) 654a-d may be turned on, i.e. α=0. The charge pump 626 may create no current, i.e., the PLL 400 may operate as a single-charge pump configuration. In this configuration, the effective capacitance of a capacitor that creates a zero in the loop filter is not increased.

The charge pump 626 illustrated in FIG. 6 is only one possible configuration that may be used with the present systems and methods. Any charge pump that produces a variable current may be used. While illustrated as having four branches, the charge pump 626 may include more or fewer than four. For example, in a configuration with two branches, the charge pump 626 may include only two current sources (I1-I4) 652a-d and two switches (S1-S4) 654a-d that operate based on two control signals 650a-d.

Figure 7:
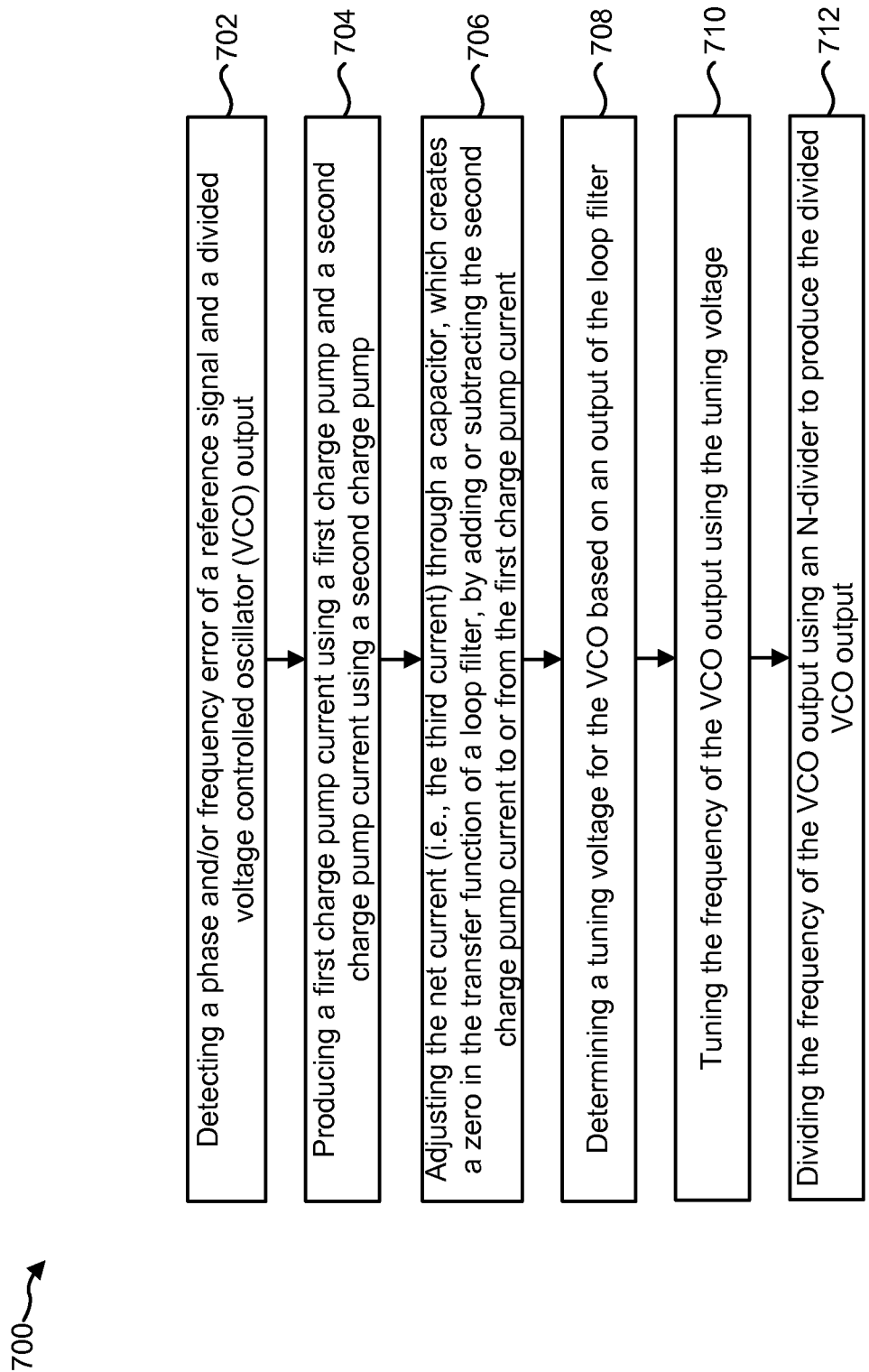
FIG. 7 is a flow diagram illustrating a method for capacitive multiplication in a loop filter.

FIG. 7 is a flow diagram illustrating a method 700 for capacitive multiplication in a loop filter 418. The method 700 may be performed by a phase locked loop (PLL) 400. The PLL 400 may detect 702 phase and/or frequency errors between a reference signal 412 and a divided voltage controlled oscillator (VCO) output 457, e.g., a PFD 416 may determine an error signal 456. The frequency of the divided output signal 457 may be the frequency of the VCO output (Vout) 424 divided by an N-divider 404. The N-divider 404 may be a fractional N-divider 404 with an optional sigma-delta modulator 430. The PLL 400 may also produce 704 a first charge pump current 432 using a first charge pump 417 and a second charge pump current 434 using a second charge pump 426, e.g., using the error signal 456 from the PFD 416.

The PLL 400 may also adjust 706 the net current (i.e., the third current 448) through a capacitor (i.e., C1 438) that creates a zero in the transfer function of a loop filter 418 by adding or subtracting the second charge pump current 434 to or from the first charge pump current 432. Specifically, the second charge pump current 434 may bleed off some of the first charge pump current 432 to produce the third current 448 that is less than the first charge pump current 432. Accordingly, the effective capacitance of the capacitor 438 may be increased, i.e., according to Equation (3). The increase of effective capacitance by reducing the current flowing through the capacitor 438 (i.e., the third current 448) may be referred to as capacitive multiplication. The PLL 400 may also determine 708 a tuning voltage (Vtune) 436 for the VCO 422 based on the output of the loop filter 418, i.e., the output of the loop filter 418 may serve as the tuning voltage (Vtune) 436 for the VCO 422. The PLL 400 may also tune 710 the frequency of the VCO output (Vout) 424 using the tuning voltage (Vtune) 436, i.e., the VCO 422 may produce an output 424 with a frequency that is based on a voltage input. The PLL 400 may also divide 712 the frequency of the VCO output (Vout) 424 using an N-divider 404 to produce a divided VCO output 457, e.g., a fractional N-divider 404 with an optional sigma-delta modulator 430.

Figure 8:
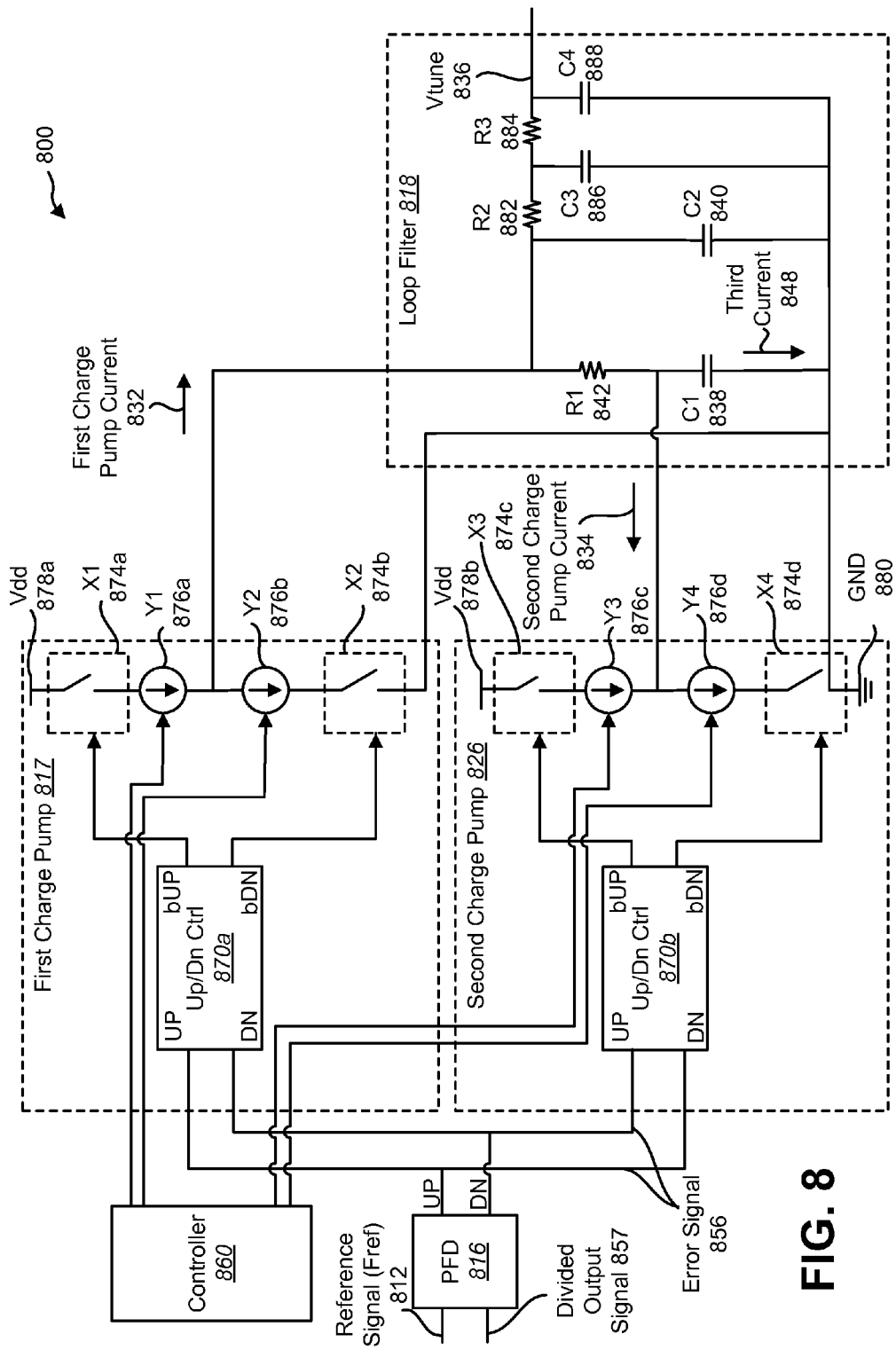
FIG. 8 is a block diagram illustrating a portion of a phase locked loop (PLL) using capacitive multiplication.

FIG. 8 is a block diagram illustrating a portion of a phase locked loop (PLL) 800 using capacitive multiplication. Specifically, FIG. 8 illustrates a phase and frequency detector (PFD) 816 that may receive a reference signal (Fref) 812 (e.g., from an external oscillator) and a divided output signal 857 and may produce an error signal 856. The divided output signal 857 may have a frequency of the VCO output (not shown) divided by an N-divider (not shown). The error signal 856 may indicate a difference in the phase and frequency of the reference signal 812 and the divided output signal 857. The error signal 856 may be a digital output signal consisting of high and/or low pulses of varying lengths sent on separate signal lines.

The first charge pump 817 and second charge pump 826 may receive this dual-line signal and produce a first charge pump current 832 and a second charge pump current 834, respectively. More specifically, an up/down controller 870a-b in each charge pump 817, 826 may receive the error signal 856, which may control whether or not the first charge pump 817 or the second charge pump 826 (or both) are turned ON or OFF. The error signal 856 may also control how long the first charge pump 817 and the second charge pump 826 is in ON state, i.e., the length of ON state. The up/down connections in the up/down controllers 870a-b may be swapped for the first charge pump 817 and the second charge pump 826. Specifically, the up/down controller 870a in the first charge pump 817 may receive the up line of the error signal 856 at an up input and a down line of the error signal 856 at a down input. In contrast, the up/down controller 870b in the second charge pump 826 may receive the up line of the error signal 856 at a down input and a down line of the error signal 856 at an up input. The output of each up/down controller 870a-b may control a switch (X1-X4) 874a-d connected to a current source (Y1-Y4) 876a-d. Specifically, a first switch (X1) 874a may couple Vdd 878a to a first current source (Y1) 876a while a second switch (X2) 874b may couple a second current source (Y2) 876b to ground 880. Similarly, a third switch (X3) 874c may couple Vdd 878b to a third current source (Y3) 876c while a fourth switch (X4) 874d may couple a fourth current source (Y4) 876d to ground 880. The current sources (Y1-Y4) 876a-d may be implemented using any suitable circuitry. Furthermore, while the first charge pump 817 and second charge pump 826 are illustrated as having single branches, they may have multiple branches, e.g., as shown in FIG. 6. In a multi-branch configuration, each switch (X1-X4) 874a-d and current source (Y1-Y4) 876a-d illustrated in FIG. 8 may be replaced by multiple switches (S1-S4) 654a-d and multiple current sources (I1-I4) 652a-d, respectively. In a multi-branch configuration, each branch may be also controlled by a control signal 650a-d, i.e., more control signals may be used than are illustrated in FIG. 8.

The output of the first charge pump 817 (i.e., the first charge pump current 832) may be taken between the first two current sources (Y1-Y2) 876a-b. Similarly, the output of the second charge pump 826 (i.e., the second charge pump current 834) may be taken between the second two current sources (Y3-Y4) 876c-d. In one configuration, a controller 860 may use control signals to control how many CP branches (e.g., current sources (Y1-Y4) 876a-d) are to be ON thus control total amount of current from a charge pump, e.g., the controller may affect the size of the first charge pump current 832, the second charge pump current 834, or both. The first charge pump current 832 may be fed to the top of the first branch of the loop filter 818, i.e., the branch with R1 842 and C1 838. The second charge pump current 834 may be coupled between R1 842 and C1 838, i.e., C1 838 may be one of the capacitors that creates a zero in the transfer function of the loop filter 818. Therefore, the second charge pump current 834 may bleed current off of the first charge pump current 832, creating a third current 848 that is smaller than the first charge pump current 832. As discussed previously, this reduction in current flowing through C1 838 may increase the effective capacitance of C1 838 (i.e., according to Equation (3)) when compared to a single-charge pump configuration. This may allow a smaller C1 838 to be fabricated while achieving an equivalent capacitance to a single-charge pump configuration.

Additionally, the loop filter 818 may include other branches that include capacitors C2 840, C3 886, C4 888 and resistors 882, 884. The output of the loop filter (Vtune) 836 may then be input to a VCO (not shown) to tune the frequency of the output of the PLL 800.

Figure 9:
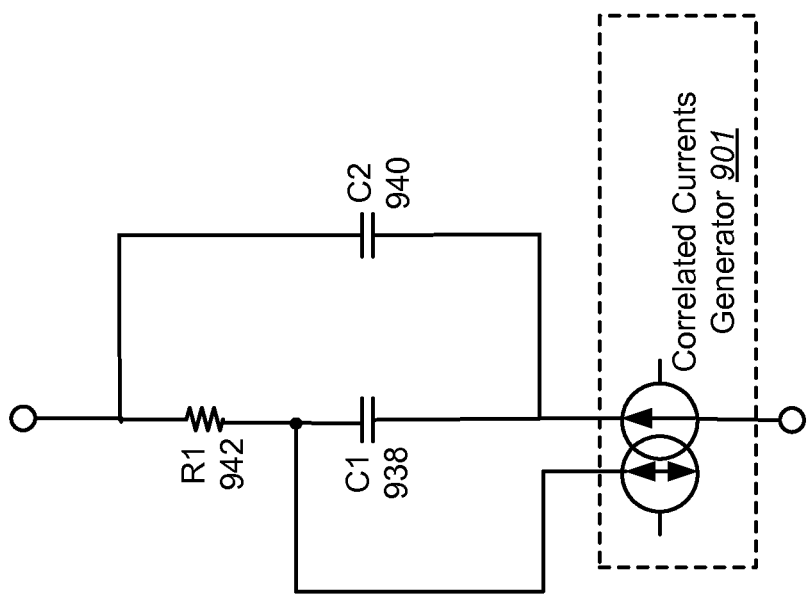
FIG. 9 is a circuit diagram illustrating capacitive multiplication in a larger circuit.

FIG. 9 is a circuit diagram illustrating capacitive multiplication in a larger circuit 900. The larger circuit 900 may be a baseband filter (BBF). The larger circuit 900 may include a correlated currents generator 901 that produces a first current and a second current that may combine to change the effective capacitance of C1 938. R1 942, C1 938 and C2 940 illustrated in FIG. 9 may correspond and function similarly to R1 442, C1 438 and C2 440 illustrated in FIG. 4.

The term "coupled" encompasses a wide variety of connections. For example, the term "coupled" should be interpreted broadly to encompass circuit elements directly connected to each other and circuit elements indirectly connected via other circuit elements.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

The term "processor" should be interpreted broadly to encompass a general purpose processor, a central processing unit (CPU), a microprocessor, a digital signal processor (DSP), a controller, a microcontroller, a state machine, and so forth. Under some circumstances, a "processor" may refer to an application specific integrated circuit (ASIC), a programmable logic device (PLD), a field programmable gate array (FPGA), etc. The term "processor" may refer to a combination of processing devices, e.g., a combination of a DSP and a microprocessor, a plurality of microprocessors, one or more microprocessors in conjunction with a DSP core, or any other such configuration.

The term "memory" should be interpreted broadly to encompass any electronic component capable of storing electronic information. The term memory may refer to various types of processor-readable media such as random access memory (RAM), read-only memory (ROM), non-volatile random access memory (NVRAM), programmable read-only memory (PROM), erasable programmable read only memory (EPROM), electrically erasable PROM (EEPROM), flash memory, magnetic or optical data storage, registers, etc. Memory is said to be in electronic communication with a processor if the processor can read information from and/or write information to the memory. Memory that is integral to a processor is in electronic communication with the processor.

The terms "instructions" and "code" should be interpreted broadly to include any type of computer-readable statement(s). For example, the terms "instructions" and "code" may refer to one or more programs, routines, sub-routines, functions, procedures, etc. "Instructions" and "code" may comprise a single computer-readable statement or many computer-readable statements.

The functions described herein may be implemented in software or firmware being executed by hardware. The functions may be stored as one or more instructions on a computer-readable medium. The terms "computer-readable medium" or "computer-program product" refers to any tangible storage medium that can be accessed by a computer or a processor. By way of example, and not limitation, a computer-readable medium may comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

Further, it should be appreciated that modules and/or other appropriate means for performing the methods and techniques described herein, such as those illustrated by FIG. 7, can be downloaded and/or otherwise obtained by a device. For example, a device may be coupled to a server to facilitate the transfer of means for performing the methods described herein. Alternatively, various methods described herein can be provided via a storage means (e.g., random access memory (RAM), read only memory (ROM), a physical storage medium such as a compact disc (CD) or floppy disk, etc.), such that a device may obtain the various methods upon coupling or providing the storage means to the device.

It is to be understood that the claims are not limited to the precise configuration and components illustrated above. Various modifications, changes and variations may be made in the arrangement, operation and details of the systems, methods, and apparatus described herein without departing from the scope of the claims.

What is claimed is:

1. A frequency synthesizer circuit, comprising:
    a phase and frequency detector;
    a first charge pump and a second charge pump, each coupled to the phase and frequency detector;
    a loop filter comprising a resistor and at least two capacitors, wherein the second charge pump is coupled between the resistor and a capacitor that creates a zero in a transfer function of the loop filter;
    a voltage controlled oscillator that produces an output frequency based on an output of the loop filter;
    an N-divider that is coupled to an output of the voltage controlled oscillator and an input of the phase and frequency detector, wherein the N-divider is a fractional N-divider that alternates between dividing the output frequency of the voltage controlled oscillator by a first divide factor and a second divide factor; and
    a sigma-delta modulator that randomizes selection of each divide factor used by the fractional N-divider while maintaining a desired time-average ratio between the divide ratios.

2. The frequency synthesizer circuit of claim 1, wherein the phase and frequency detector is configured to produce an error signal that indicates a difference in phase and frequency of a reference signal and a divided output signal of the voltage controlled oscillator.

3. The frequency synthesizer circuit of claim 1, wherein the first charge pump produces a first current and the second charge pump produces a second current, wherein the first current combines with the second current to produce a third current that flows through the capacitor that creates a zero in a transfer function of the loop filter.

4. The frequency synthesizer circuit of claim 3, wherein the third current is smaller than the first current, which increases the effective capacitance (Ceq) of the capacitor that creates a zero in a transfer function of the loop filter.

5. The frequency synthesizer circuit of claim 3, wherein the third current is larger than the first current, which decreases the effective capacitance (Ceq) of the capacitor that creates a zero in a transfer function of the loop filter.

6. The frequency synthesizer circuit of claim 1, wherein the effective capacitance (Ceq) of the capacitor that creates a zero in a transfer function of the loop filter is given by $Ceq=C1/(1-\alpha)$ where C1 is the capacitance of the capacitor that creates a zero in a transfer function of the loop filter and $\alpha$ is a ratio of the second current to the first current.

7. An integrated circuit for capacitive multiplication, comprising:
    a phase and frequency detector;
    a first charge pump and a second charge pump, each coupled to the phase and frequency detector;
    a loop filter comprising a resistor and at least two capacitors, wherein the second charge pump is coupled between the resistor and a capacitor that creates a zero in a transfer function of the loop filter;
    a voltage controlled oscillator that produces an output frequency based on an output of the loop filter;
    an N-divider that is coupled to an output of the voltage controlled oscillator and an input of the phase and frequency detector, wherein the N-divider is a fractional N-divider that alternates between dividing the output frequency of the voltage controlled oscillator by a first divide factor and a second divide factor; and
    a sigma-delta modulator that randomizes selection of each divide factor used by the fractional N-divider while maintaining a desired time-average ratio between the divide ratios.

8. The integrated circuit of claim 7, wherein the phase and frequency detector is configured to produce an error signal that indicates a difference in phase and frequency of a reference signal and a divided output signal of the voltage controlled oscillator.

9. The integrated circuit of claim 7, wherein the first charge pump produces a first current and the second charge pump produces a second current, wherein the first current combines with the second current to produce a third current that flows through the capacitor that creates a zero in a transfer function of the loop filter.

10. The integrated circuit of claim 9, wherein the third current is smaller than the first current, which increases the effective capacitance (Ceq) of the capacitor that creates a zero in a transfer function of the loop filter.

11. The integrated circuit of claim 9, wherein the third current is larger than the first current, which decreases the effective capacitance (Ceq) of the capacitor that creates a zero in a transfer function of the loop filter.

12. The integrated circuit of claim 7, wherein the effective capacitance (Ceq) of the capacitor that creates a zero in a transfer function of the loop filter is given by $Ceq=C1/(1-\alpha)$ where C1 is the capacitance of the capacitor that creates a zero in a transfer function of the loop filter and $\alpha$ is a ratio of the second current to the first current.

13. A method for capacitive multiplication, comprising:
    detecting an error between a phase and frequency of a reference signal and a divided voltage controlled oscillator (VCO) output;
    producing a first current using a first charge pump and a second current using a second charge pump;
    adjusting net current through a capacitor that creates a zero in the transfer function of a loop filter by adding or subtracting the second current to or from the first current;
    determining a tuning voltage for the VCO based on an output of the loop filter;
    tuning a frequency of the VCO using the tuning voltage; and
    dividing a frequency of the VCO output using an N-divider to produce the divided VCO output, wherein the N-divider is a fractional N-divider that alternates between dividing the frequency of the VCO output by a first divide factor and a second divide factor, and wherein the fractional N-divider further comprises a sigma-delta modulator that randomizes selection of each divide factor used by the fractional N-divider while maintaining a desired time-average ratio between the divide ratios.

14. The method of claim 13, wherein the effective capacitance (Ceq) of the capacitor that creates a zero in a transfer function of the loop filter is given by $Ceq=C1/(1-\alpha)$ where C1 is the capacitance of the capacitor that creates a zero in a transfer function of the loop filter and $\alpha$ is a ratio of the second current to the first current.

15. A frequency synthesizer for capacitive multiplication, comprising:
    means for detecting an error between a phase and frequency of a reference signal and a divided voltage controlled oscillator (VCO) output;
    means for producing a first current and a second current;
    means for adjusting net current through a capacitor that creates a zero in the transfer function of a loop filter by adding or subtracting the second current to or from the first current;
    means for determining a tuning voltage for the VCO based on an output of the loop filter;

means for tuning a frequency of the VCO using the tuning voltage;

means for dividing a frequency of the VCO output to produce the divided VCO output, wherein the means for dividing a frequency alternates between dividing the frequency of the voltage controlled oscillator (VCO) output by a first divide factor and a second divide factor, and wherein means for dividing further comprises means for randomizing selection of each divide factor while maintaining a desired time-average ratio between the divide ratios.

16. The frequency synthesizer of claim 15, wherein the effective capacitance (Ceq) of the capacitor that creates a zero in a transfer function of the loop filter is given by $Ceq=C1/(1-\alpha)$ where C1 is the capacitance of the capacitor that creates a zero in a transfer function of the loop filter and $\alpha$ is a ratio of the second current to the first current.

* * * * *